(12) United States Patent
Sumiyoshi et al.

(10) Patent No.: US 7,365,826 B2
(45) Date of Patent: Apr. 29, 2008

(54) PROJECTION OPTICAL SYSTEM, EXPOSURE APPARATUS AND METHOD USING THE SAME

(75) Inventors: Yuhei Sumiyoshi, Tochigi (JP); Masayuki Suzuki, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 189 days.

(21) Appl. No.: 11/302,155

(22) Filed: Dec. 14, 2005

(65) Prior Publication Data
US 2006/0092392 A1    May 4, 2006

Related U.S. Application Data

(63) Continuation of application No. 10/407,721, filed on Apr. 4, 2003, now Pat. No. 7,006,194.

(30) Foreign Application Priority Data

Apr. 5, 2002  (JP) ............................. 2002-104484

(51) Int. Cl.
| | | |
|---|---|---|
| *G03B 27/52* | (2006.01) | |
| *G03B 27/54* | (2006.01) | |
| *G03B 27/42* | (2006.01) | |
| *G03B 27/68* | (2006.01) | |

(52) U.S. Cl. .......................... 355/30; 355/52; 355/53; 355/67; 359/512; 359/694; 359/820; 359/822

(58) Field of Classification Search ................. 355/30, 355/52, 53, 67; 359/512, 694, 820, 822
See application file for complete search history.

(56) References Cited

U.S. PATENT DOCUMENTS

| | | | |
|---|---|---|---|
| 5,424,552 | A | 6/1995 | Tsujii et al. |
| 5,805,273 | A | 9/1998 | Unno |
| 5,836,667 | A | 11/1998 | Baker et al. |
| 5,852,518 | A | 12/1998 | Hatasawa et al. |
| 6,262,793 | B1 | 7/2001 | Sasaya et al. |
| 6,359,678 | B1 | 3/2002 | Ota |
| 6,522,392 | B1 | 2/2003 | Muller-Rissmann et al. |
| 6,549,270 | B1 | 4/2003 | Ota |
| 6,678,240 | B2 | 1/2004 | Geh et al. |
| 6,757,051 | B2 | 6/2004 | Takahashi et al. |
| 2002/0186359 | A1 | 12/2002 | Meisburger et al. |

FOREIGN PATENT DOCUMENTS

| | | |
|---|---|---|
| JP | 02-297919 | 12/1990 |
| JP | 06-349702 | 12/1994 |
| JP | 6-349702 | 12/1994 |
| JP | 08-008178 | 1/1996 |
| JP | 08-327895 | 12/1996 |
| JP | 11-243052 | 9/1999 |
| JP | 11-251225 | 9/1999 |
| JP | 2000-286189 | 10/2000 |

*Primary Examiner*—Alan Mathews
(74) *Attorney, Agent, or Firm*—Morgan & Finnegan LLP

(57) ABSTRACT

A projection optical system includes an optical element that includes and locally uses a reflective or refractive area that is substantially axially symmetrical around an optical axis, the optical element being rotatable around the optical axis.

5 Claims, 8 Drawing Sheets

PROJECTION OPTICAL SYSTEM, EXPOSURE APPARATUS AND METHOD USING THE SAME

This application is a continuation application of U.S. patent application Ser. No. 10/407,721 filed on Apr. 4, 2003, which issued as U.S. Pat. No. 7,006,194 on Feb. 28, 2006, which is herein incorporated by reference.

BACKGROUND OF THE INVENTION

The present invention relates to an exposure apparatus for exposing an object, such as a single crystal substrate and a glass plate for a liquid crystal display ("LCD"). The present invention is especially suitable for an exposure apparatus that uses ultraviolet ("UV") and extreme ultraviolet ("EUV") light as an exposure light source.

Along with the recent demand on smaller and lower profile electronic devices, a miniaturization of semiconductor devices to be mounted onto these electronic devices have been increasingly demanded. For example, a design rule for a mask pattern requires that an image with a size of a line and space (L & S) of less than 0.1 μm be extensively formed, and predictably, it will further move to a formation of circuit patterns of less than 80 nm in the future. L & S denotes an image projected to a wafer in exposure with equal line and space widths, and serves as an index of exposure resolution.

A projection exposure apparatus, which is a typical exposure apparatus for fabricating semiconductor devices, includes a projection optical system that projects and exposes a pattern formed on a mask or a reticle (which are used interchangeably in the present application) onto a wafer. Resolution R of a projection exposure apparatus (i.e., a minimum size which enables a precise transfer of an image) can be given by using a light-source wavelength λ and the numerical aperture (NA) of the projection optical system as in the following equation:

$$R = k_1 \times \frac{\lambda}{NA} \quad (1)$$

As the shorter the wavelength becomes and the higher the NA increases, the better the resolution becomes. The recent trend has required that the resolution be a smaller value; however it is difficult to meet this requirement using only the increased NA, and the improved resolution expects use of a shortened wavelength. Exposure light sources have currently been in transition from KrF excimer laser (with a wavelength of approximately 248 nm) and ArF excimer laser (with a wavelength of approximately 193 nm) to $F_2$ excimer laser (with a wavelength of approximately 157 nm). Practical use of the EUV light is being promoted as a light source.

As a shorter wavelength of light limits usable glass materials for transmitting the light, it is advantageous for the projection optical system to use reflection elements, i.e., mirrors, instead of using many refraction elements, i.e., lenses. No applicable glass materials have been proposed for the EUV light as exposure light, and a projection optical system could not include any lenses. It has thus been proposed to form a reflection type reduction projection optical system only with mirrors. In the reflection type or catoptric optical system, respective mirrors and a surface shape of each mirror are arranged axially symmetrical around one optical axis.

However, an area or slit used for exposure is a limited area that is apart from the optical axis, and one or more mirrors in the catoptric optical system receive exposure light locally or partially. Such a mirror as locally receives the exposure light generates a temperature difference in its materials, deforms its surface shape, and deteriorates its optical performance. Accordingly, Japanese Laid-Open Patent Application No. 11-243052, for example, discloses a catoptric projection optical system provided with a cooling unit for mitigating a temperature difference on the mirror.

However, the catoptric projection optical system proposed in Japanese Laid-Open Patent Application No. 11-243052 provides the cooling unit at the rear side of an unilluminated area and reflection surface of a mirror that uses only part for exposure, and thus the temperature difference generated in the mirror cannot be mitigated sufficiently. After all, the surface shape changes and deteriorates the optical performance, and this system cannot obtain desired resolution.

BRIEF SUMMARY OF THE INVENTION

Accordingly, it is an exemplified object of the present invention to provide a projection optical system, and an exposure apparatus and method, which may obtain desired resolution, and provide superior exposure performance.

A projection optical system of one aspect of the present invention includes an optical element that includes and locally uses a reflective or refractive area that is substantially axially symmetrical around an optical axis, said optical element being rotatable around the optical axis.

The projection optical system may include a cooling unit that cools the area directly. The area may have a surface shape that changes aberration when said optical element rotates. The aberration may include at least one of a curvature of field, distortion and coma. The projection optical system may further include another axially asymmetrically shaped optical element, said optical element rotating and reducing aberration caused by said other optical element. The aberration may include astigmatism. The optical element may have a hole at a center thereof, through which light passes. The projection optical system may use light having a wavelength of 20 nm or smaller. The optical element may have an aspheric surface.

An exposure method of another aspect of the present invention includes the steps of evaluating a deterioration of a projection optical system for projecting, onto an object to be exposed, light from a mask which forms a pattern, selecting, based on a result of said evaluating step, a predetermined area on the optical element for correcting the deterioration of the projection optical system, and exposing the object to be exposed using the predetermined area.

The evaluating step may evaluate based on exposure does of the predetermined area, an exposure result of the object, or aberration that occurs in the projection optical system. The selecting step may select the area by rotating the optical element or by selecting one of plural optical elements. The selected one of plural optical elements may have a reflection element having an aspheric surface.

An exposure apparatus of another aspect of the present invention includes the above projection optical system.

A device fabricating method of another aspect of the present invention includes the steps of exposing an object using the above exposure apparatus, and performing a predetermined process for the exposed object. Claims for a device fabricating method for performing operations similar to that of the above exposure apparatus cover devices as intermediate and final products. Such devices include semiconductor chips like an LSI and VLSI, CCDs, LCDs, magnetic sensors, thin film magnetic heads, and the like.

Other objects and further features of the present invention will become readily apparent from the following description of the preferred embodiments with reference to accompanying drawings.

DETAILED DESCRIPTION OF THE PREFERRED EMBODIMENTS

A description will now be given of a reflection type projection optical system 300 and an exposure apparatus 200 as one aspect of the present invention with reference to the accompanying drawings. The present invention is not limited to these embodiments and each element is replaceable within a scope that achieves the objects of the present invention. Here, FIG. 1 is a schematic structural view showing the exposure apparatus 1 of one aspect according to the present invention.

Figure 1:
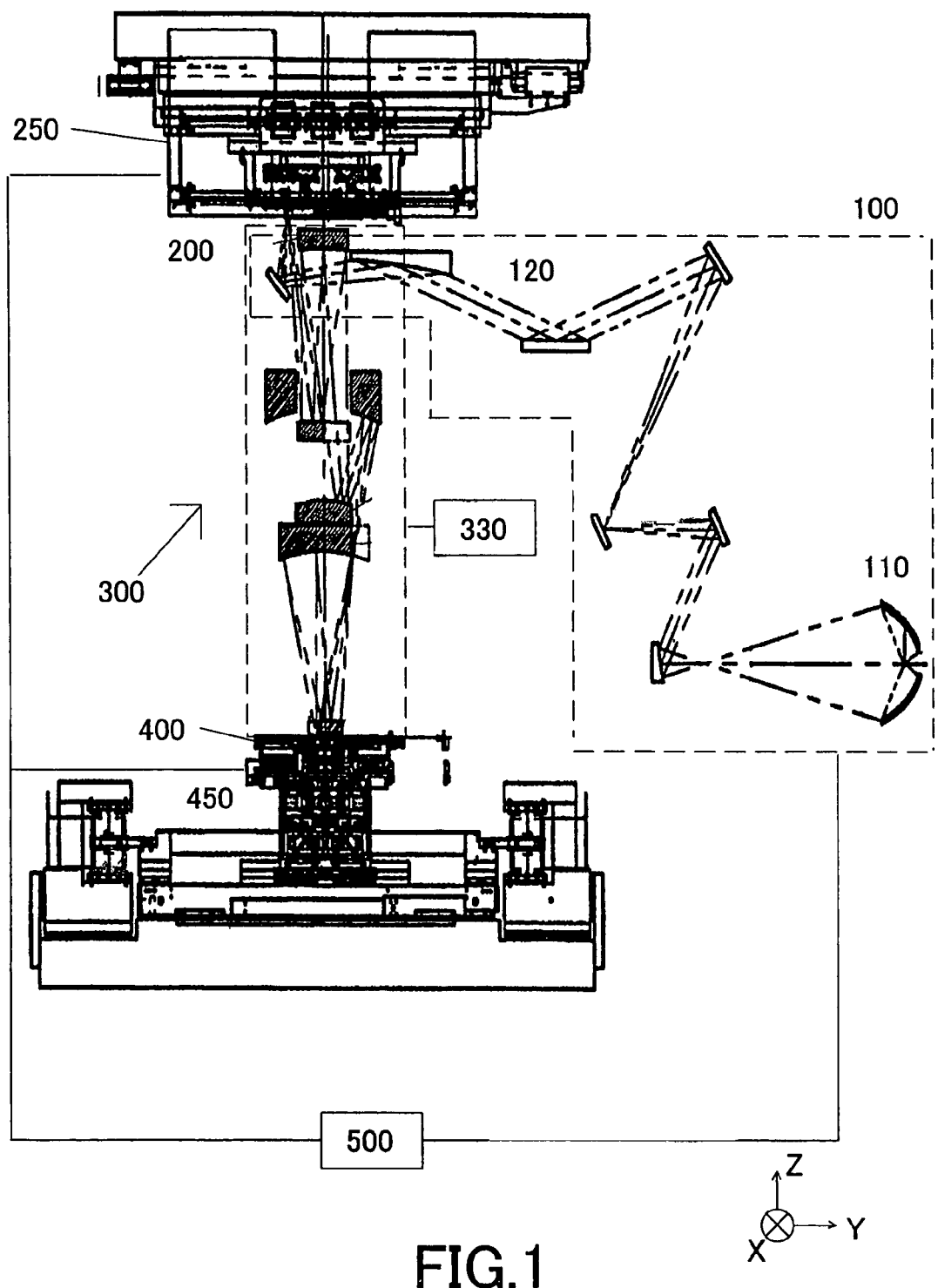
FIG. 1 is a schematic sectional view showing an exposure apparatus of one embodiment according to the present invention.

The exposure apparatus 1 includes, as shown in FIG. 1, an illumination apparatus 100, a mask 200, a projection optical system, a plate 400, and a controller 500.

The exposure apparatus 1 uses, as illumination light for exposure, an EUV ray (with a wavelength of, e.g., 13.4 nm) to exposes onto the plate 400 a circuit pattern formed on the mask 200, for example, in a step-and-repeat manner and step-and-scan manner. This projection exposure apparatus is suitable for a lithography process of a submicron or a quarter-micron or less, and thus a description will be given of a step-and-scan type exposure apparatus (also called as a "scanner") as an example in this embodiment. Here, the "step-and-repeat manner" is one mode of exposure method that moves a wafer stepwise to an exposure area for the next shot every shot of cell projection onto the wafer. The "step-and-scan manner," is another mode of exposure method that exposes a mask pattern onto a wafer by continuously scanning the wafer relative to the mask, and by moving, after a shot of exposure, the wafer stepwise to the next exposure area to be shot. Since the EUV light has low transmittance for air, at least the optical path through which the EUV light travels is desirably accommodated in a vacuum atmosphere, although not shown in FIG. 1.

The illumination apparatus 100 uses an EUV ray with a wavelength less than 20 nm (with a wavelength of, e.g., 13.4 nm) to illuminate the mask 200 that forms a circuit pattern to be transferred, and includes a light source part 110 and an illumination optical system 120.

The EUV light source 110 uses, for example, a laser plasma light source. The laser plasma light source irradiates a highly intensified pulse laser beam to a target material put in vacuum, thus generating high-temperature plasma for use as EUV light with a wavelength of about 13.4 nm emitted from this. The target material may use a metallic thin film, inert gas, and droplets, etc. The pulse laser preferably has high repetitive frequency, e.g., usually several kHz, for increased average intensity of the emitted EUV light. Alternatively, the EUV light source 110 may use a discharge plasma light source, which emits gas around an electrode put in vacuum, applies pulse voltage to the electrode for discharge, and induces high-temperature plasma. This plasma emits the EUV light, for example, with a wavelength of about 13.4 nm to be utilized. Of course, the light source part 110 is not limited to them, but may use any technology known in the art.

The illumination optical system 120 propagates the EUV light, illuminates the mask 200, and includes a condenser optical system, an optical integrator, an aperture stop, a blade, etc. For example, the condenser optical system includes one or more mirrors for condensing EUV light that is radiated approximately isotropically from the light source part 110, and the optical integrator uniformly illuminates the mask 200 with a predetermined aperture.

A debris eliminator (not shown) is preferably arranged between the light source part 110 and the illumination optical system 120 to eliminate debris generated concurrently when the EUV light is produced.

The mask 200 is a catoptric mask or a transmission type mask, such as a die-cutting mask, and forms a circuit pattern or image to be transferred. It is supported and driven by a mask stage 250. The diffracted light emitted from the mask 200 is projected onto the plate 400 after reflected by the projection optical system 300. The mask 200 and plate 400 are arranged optically conjugate with each other. Since the exposure apparatus 1 of this embodiment is a scanner, the mask 200 and plate 400 are scanned to transfer a pattern on the reticle 220 onto the plate 230.

The mask stage 250 supports the mask 200, and is connected to a moving mechanism (not shown). The mask stage 250 may use any structure known in the art. The moving mechanism (not shown) includes a linear motor, etc., and moves the mask 200 under control by the controller 500 by driving the mask stage 250 in the direction Y. The exposure apparatus 1 synchronously scans the mask 200 and plate 400 through the controller 500 for exposure.

Figure 2:
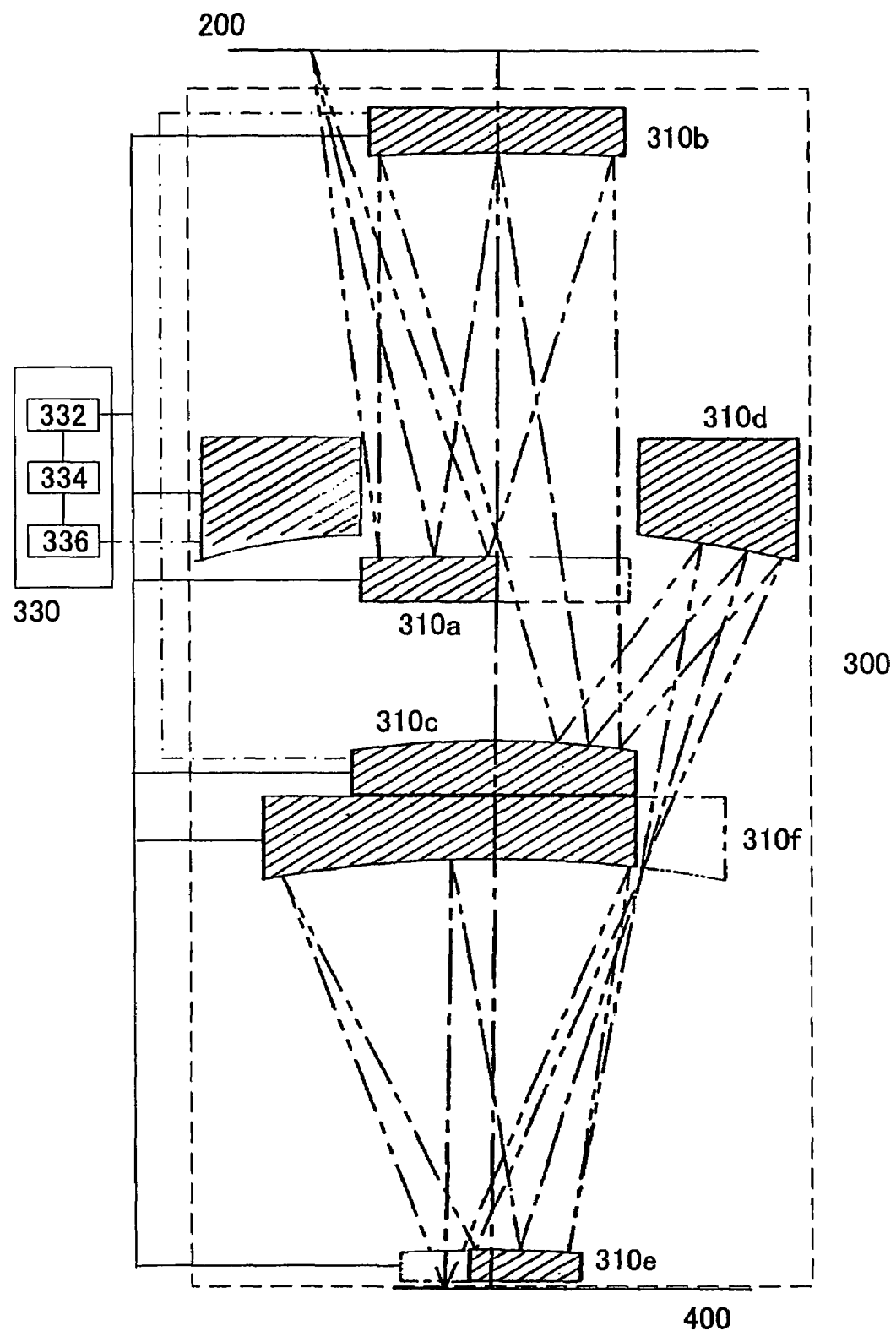
FIG. 2 is a schematic sectional view showing a projection optical system of one embodiment according to the present invention.

The projection optical system 300 is a catoptric optical system that projects light from an object surface (such as the mask 200) onto an image surface (such as a surface of the object to be exposed, i.e., the plate 400) using reflections. The projection optical system 300 of the instant embodiment exemplarily includes, as shown in FIG. 2, an optical element 310 that generalizes optical elements 310a to 310f, and a projection control part 330. FIG. 2 is a schematic sectional view of the projection optical system 300 of one embodiment according to the present invention.

The optical element 310 images the light using the reflections. The optical element 310 includes a mirror onto which a multilayer film that reflects the EUV ray, and intensifies the light. A conceivable multilayer that is applicable to the optical element 310 is, for example, a Mo/Si multilayer film created by reciprocally laminating a molybdenum (Mo) layer and a silicon (Si) layer onto a reflection surface or a Mo/Be multilayer film created by reciprocally laminating a molybdenum (Mo) layer and a beryllium (Be) layer onto a reflection surface. For a wavelength range near a wavelength of 13.4 nm, the optical element 310 composed of a Mo/Si multilayer film can obtain a reflectance of 67.5%, and for a wavelength range near a wavelength of 11.3 nm, the optical element 310 composed of a Mo/Be multilayer film can obtain a reflectance of 70.2%. However, the multilayer film applicable to the optical element 310 is not limited the above materials, and the present invention does not prevent an application of a multilayer film that has an operation and effect similar to those of the above.

Figure 3A:
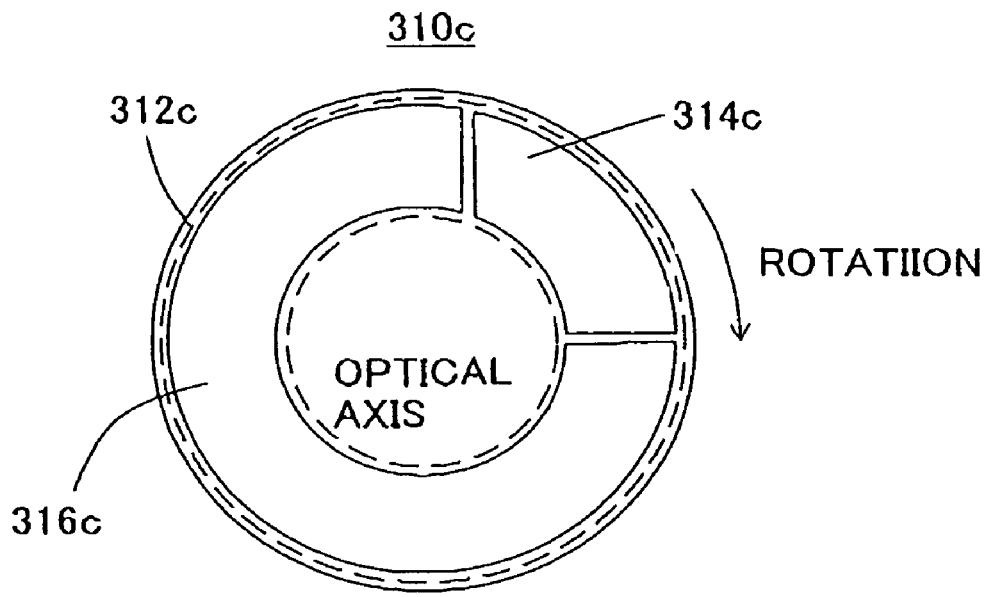
FIG. 3 is a plane view showing an exemplary optical element shown in FIG. 2.
Figure 4A:
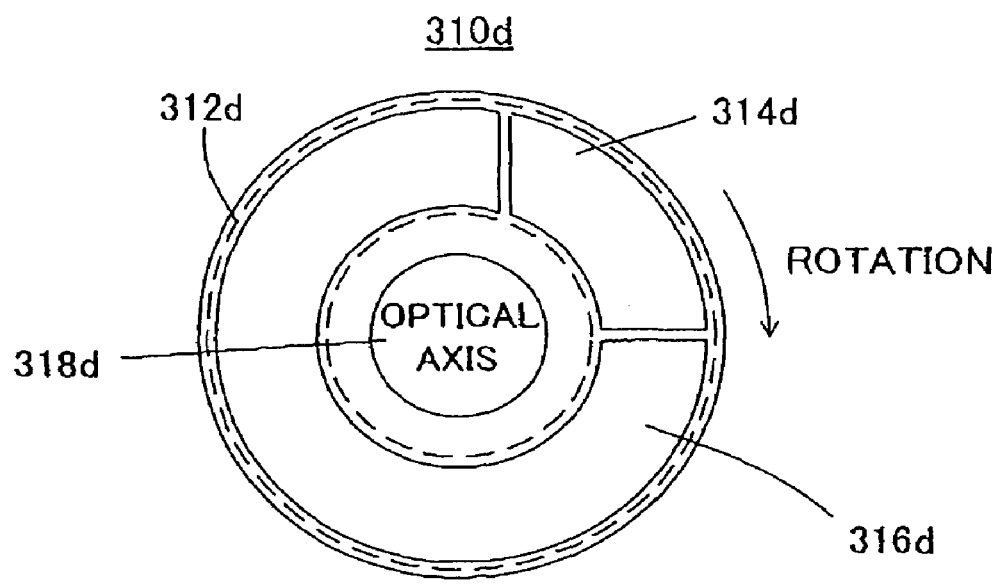
FIG. 4 is a plane view showing the exemplary optical element shown in FIG. 2.

Among the optical elements 310, third and fourth optical elements 310c and 310d in order of reflection of light from a side of the mask 200, have areas 312c and 312d for reflecting the light and are arranged rotatable around the optical axis, as shown in FIGS. 3A and 4A. The optical element 310d has a hole 318d at its center through which the light passes. Entire surfaces of areas 312c and 312d on the optical element 310c and 310d do not receive the exposure light (which means herein light on an optical path from the mask to the image surface and does not mean light that necessarily contributes to exposure) during exposure, and include local areas that receive the exposure light (i.e., illuminated area) 314c and 314d, and areas that do not receive the exposure light (i.e., unilluminated area) 316c and 316d. When the illuminated areas 314c and 314d receive the exposure light, a temperature difference or distribution occurs between the illuminated areas 314c and 314d and the unilluminated area 316c and 316d. However, when the optical elements 310c and 310d are rotated around the optical axis, the entire surfaces of the areas 312c and 312d may receive the exposure light all around. This mitigates locality of the temperature distribution, restrains a deterioration of the optical performance that results from a change of the surface shape of the optical element 310, and obtains desired resolution.

Figure 3B:
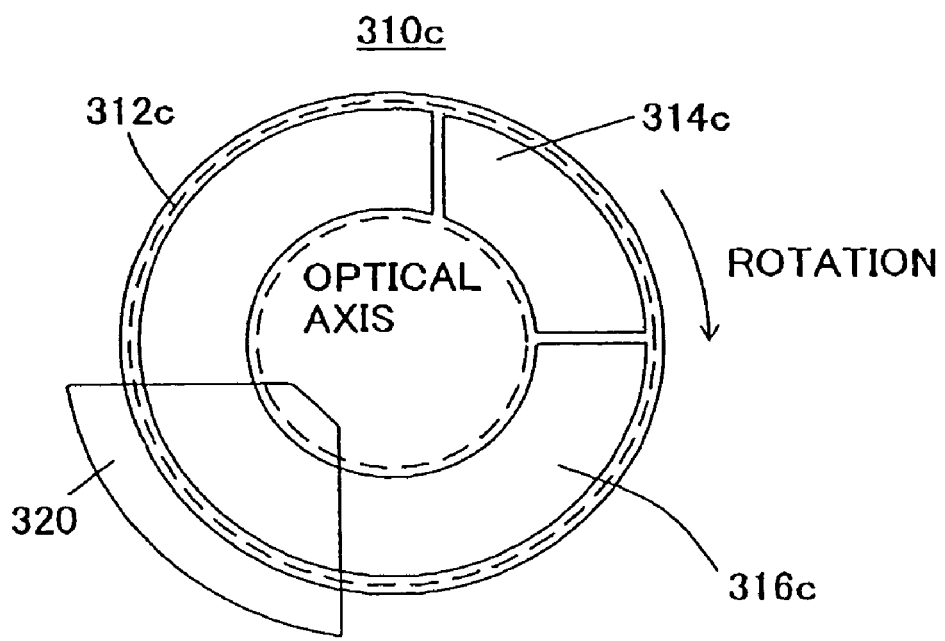
Figure 4B:
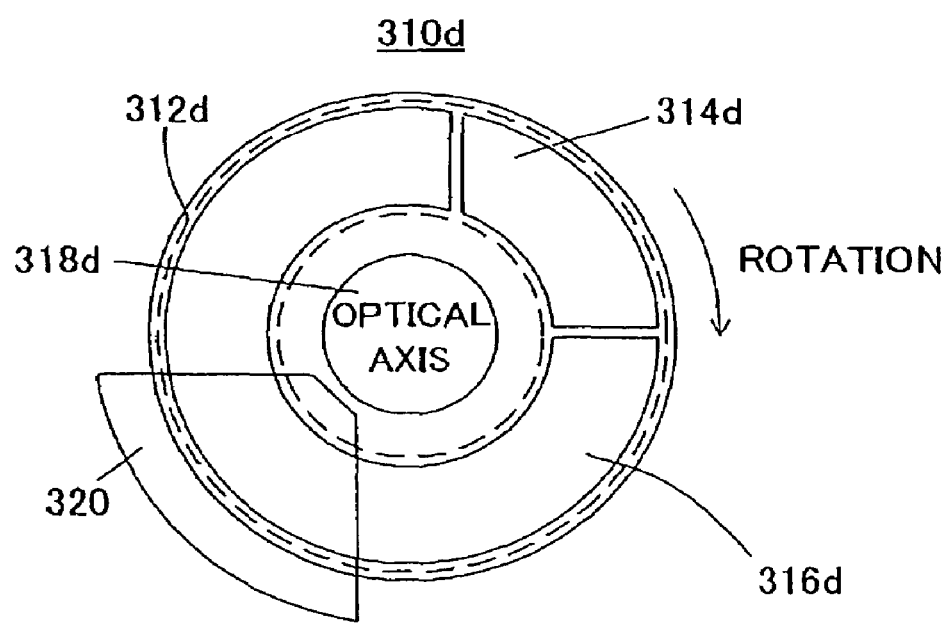

As shown in FIGS. 3B and 4B, the cooling unit 320 may be provided and cool the areas 312c and 312d on the optical elements 310c and 310d, i.e., unilluminated areas 316c and 316d. The cooling unit 320 may cool the areas 312c and 312d directly using the cooling liquid. Therefore, a temperature distribution that occurs in the optical elements 310c and 310d may be restrained more effectively than those shown in FIG. 3A and 4A. This may effectively restrain the deterioration of the optical performance that results from a change in surface shapes of the optical elements 310c and 310d, and obtain the desired resolution. Here, FIGS. 3 and 4 are plane views of exemplary optical elements 310c and 310d. FIGS. 3A and 4A show a case where the cooling unit 320 is not provided, while FIGS. 3B and 4B show a case where the cooling unit 320 is provided.

Figure 5:
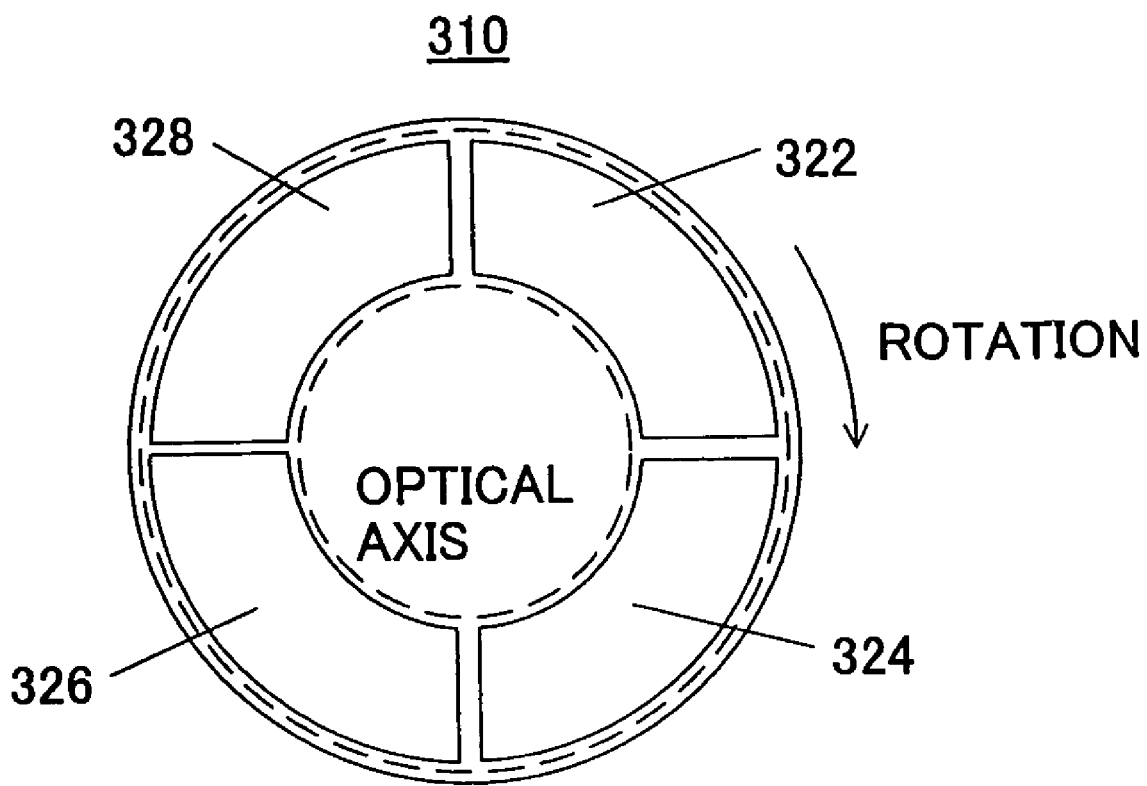
FIG. 5 is a plane view of an optical element that is rotatable around an optical axis and has a surface shape for correcting a deterioration of another optical element due to a change of surface shape of the other optical element.

Some of the optical elements 310 (e.g., first, fifth and sixth optical elements 310a, 310e and 310f in order from the side of the mask 200 in this embodiment) cannot rotate around the optical axis due to their axially asymmetrical shape. Therefore, the optical elements 310a, 310f and 310e cannot prevent surface-shape changes utilizing the aforementioned rotations around the optical axis. Accordingly, as shown in FIG. 5, the optical element 310 that may rotate around the optical axis (e.g., the optical elements 310b, 310c and 310d in the instant embodiment) has been previously provided with areas 322 to 328 having surface shapes for correcting a deterioration of optical performance caused by a change in surface shape of the optical elements 310a, 310f and 310e.

In other words, the areas 322 to 328 form surface shapes for correcting aberration that occurs when the surface shapes of the optical elements 310a, 310f and 310e that cannot rotate around the optical axis. The aberration includes at least one of a curvature of field, distortion and coma. The areas 322 to 328 are appropriately switched in accordance with the aberration that occurs due to the deformation of the optical elements 310a, 310f and 310e. This may correct the aberration that occurs due to the deformation of the optical elements 310a, 310f and 310e, which are not rotatable around the optical axis, by the optical elements 310c and 310d that are rotatable around the optical axis, prevent the deterioration of the optical performance, and obtain the desired resolution. FIG. 5 is a plane view of an optical element that is rotatable around an optical axis and has a surface shape for correcting a deterioration of another optical element due to a surface-shape change of the other optical element. Although FIG. 5 shows four areas 322 to 328, the number and shapes are for illustrative purposes only.

Optionally, the optical element 310 that receives the exposure light on its entire surface (e.g., the optical element 310 formed at the pupil position in the instant embodiment) may be previously provided with a surface shape for generating astigmatism, and rotated to remove the astigmatism generated during exposure. Moreover, the optical element 310 may be rotated to adjust the astigmatism at the time of assembling the projection optical system 300.

A projection controller 330 includes a detector part 332, a determination part 334, and a drive part 336. The detector part 332 is connected to the optical element 310 in the projection optical system 300 and determination part 334, and detects the exposure dose of the optical element 310. The detected exposure dose of the optical element 310 is transmitted to the determination part 334. The determination part 334 is connected to the detector part 332 and the drive part 336, and determines based on data from the detector part 332 whether the optical performance the projection optical system 300 deteriorates. The determination part 334 selects the optical element 310 and areas 322 to 328 for correcting the deterioration of the optical performance of the projection optical system 300, and transmits the information to the drive part 336. The drive part 336 is connected to the determination part 334 and the optical element 310 that is rotatable around the optical axis, and rotates the optical element 310 so as to realize the exposure using the optimal areas 322 to 328 on the optical element 310, which has been selected by the determination part 334.

Figure 6:
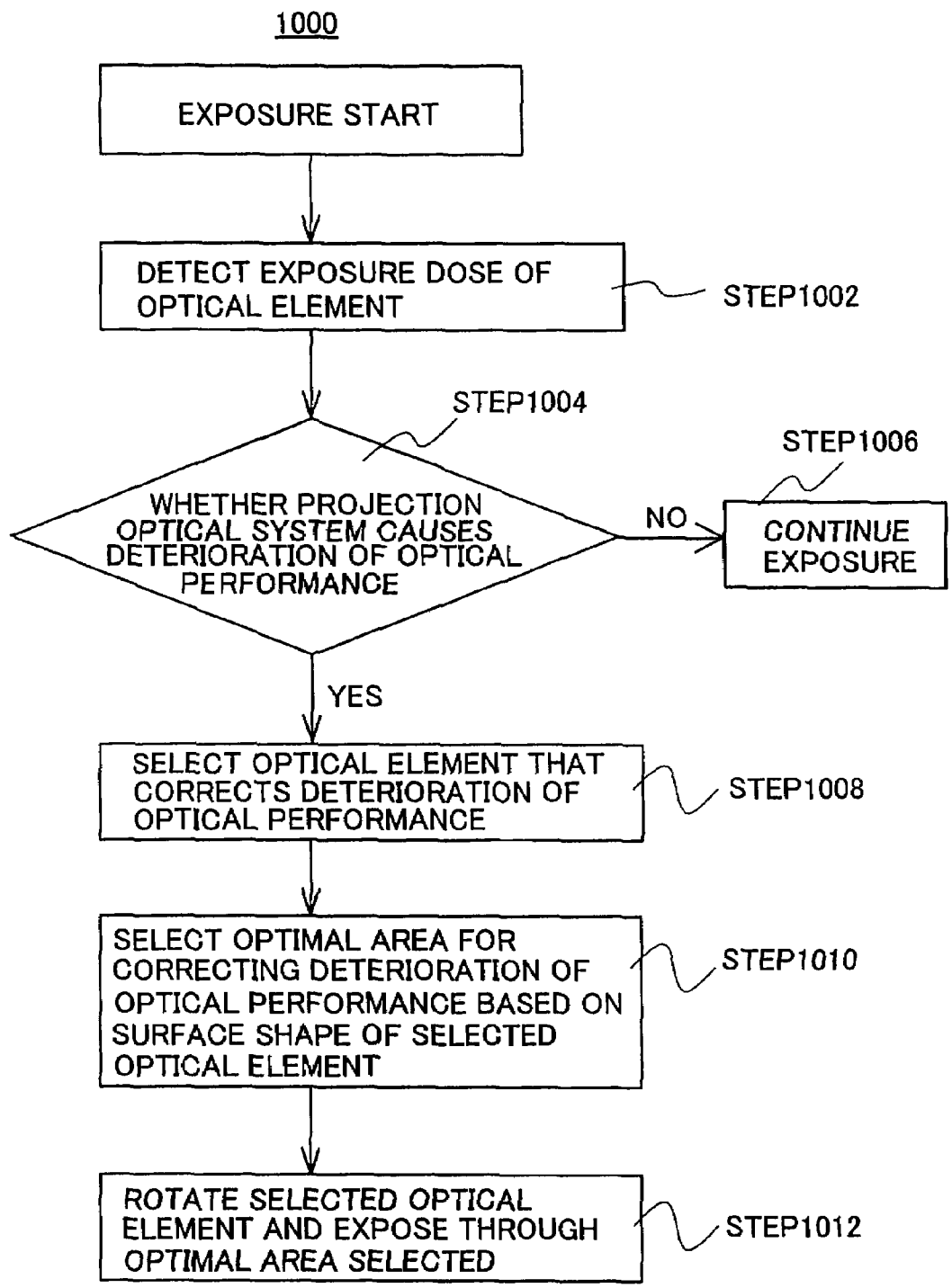
FIG. 6 is a flowchart for explaining an exposure method according to the present invention.

A description will be given of the exemplary inventive exposure method using the projection optical system 300 with reference to FIG. 6. FIG. 6 is a flowchart for explaining the inventive exposure method 1000. When the exposure apparatus 1 starts exposure, the detector part 332 in the projection controller 330 starts detecting the light amount of the exposure light (step 1002). Next, the exposure amount detected by the detector part 332 is transmitted to the determination part 334, and the determination part 334 determines whether projection optical system 300 causes deterioration of optical performance (step 1004). When the determination part 334 determines that no deterioration of the optical performance would occur, the exposure continues as it is (step 1006). When the determination part 334 determines that a deterioration of the optical performance would occur, the optical element 310 that forms a surface shape for correcting deterioration of optical performance is selected (step 1008). The determination part 334 also selects optimal areas 312 to 318 for correcting a deterioration of optical performance from the surface shape of selected optical element 310. Then, the drive part 336 rotates the selected optical element 310 and expose through the selected optimal areas 312 to 318 for correcting the deterioration of the optical performance (step 1012). Of course, the deterioration of the optical performance in the projection optical system 300 may be determined based on the aberration in the projection optical system 300 and an exposure result.

Turning back to FIG. 1, the plate 400 is an exemplary object to be exposed, such as a wafer and a LCD, and photoresist is applied to the plate 400. A photoresist application step includes a pretreatment, an adhesion accelerator application treatment, a photo-resist application treatment, and a pre-bake treatment. The pretreatment includes cleaning, drying, etc. The adhesion accelerator application treatment is a surface reforming process so as to enhance the adhesion between the photoresist and a base (i.e., a process to increase the hydrophobicity by applying a surface active agent), through a coat or vaporous process using an organic film such as HMDS (Hexamethyl-disilazane). The pre-bake treatment is a baking (or burning) step, softer than that after development, which removes the solvent.

The plate 400 is supported by the plate stage 450. For example, the plate stage 450 moves the plate 400 in XYZ directions. The mask 200 and plate 400 are scanned synchronously under control by the controller 500. The positions of the mask stage 250 and plate stage 450 are monitored, for example, by a laser interferometer and the like, so that both are driven at a constant speed ratio.

The controller 500 includes a CPU and memory, which are not shown, and controls operations of the exposure apparatus 1. The control part 500 is connected electrically to an illumination apparatus 100, (the moving mechanism (not shown) in) the mask stage 250, and (the moving mechanism (not shown) in) the plate stage 450. The CPU covers any processor, irrespective of its name, such as an MPU, and controls operations of each module. The memory includes a ROM and RAM, and stores firmware for operations of the exposure apparatus 1. The controller 500 may serve as and be integrated with the projection controller 330.

In exposure, the EUV light emitted from the illumination apparatus 100 illuminates the mask 200. The EUV light that reflects the circuit pattern on the mask 200 is imaged on the plate 400 by the projection optical system 300. The instant embodiment exposes the entire surface of the mask 200 by scanning the mask 200 and plate 400 at a speed of the reduction ratio.

The projection optical system 300 of this embodiment includes, in order from the mask 200 to the plate 400, a convex aspheric catoptric element, a concave aspheric catoptric element, a convex aspheric catoptric element, a concave aspheric catoptric element, and a convex aspheric catoptric element, but the present invention does not limit the projection optical system 300 to this structure.

For example, the number of catoptric elements may be other than six, and the power arrangement of the catoptric elements is not limited to a convex, concave, convex, concave, convex and concave. Various projection optical systems are known in the art, and thus those skilled in the art would arrange at least one catoptric element among plural catoptric elements around the optical axis rotatably in the known projection optical system based on the disclosure of the instant specification.

Unlike the above embodiments, the present invention does not limit the projection optical system to the catoptric optical system, but may use a known catadioptric projection optical system so that at least one of plural refractive elements (i.e., lenses) and reflective elements (i.e., mirrors) in the optical system may rotate around the optical axis to reduce the aberration.

The above embodiment has an object to correct aberrations generated in the projection optical system due to thermal deformations of non-rotatable optical elements 310a, 310e, 310f, etc., aberration originally included in this projection optical system, and aberration generated in the element 310b that reflects light (i.e., exposure light) on its entire surface although it is not rotatable. In order to correct these aberrations, one or more predetermined reflection areas are selected in one or more of reflection surfaces in the rotatable optical elements 310b, 310c, and 310d. In selecting the predetermined reflection area(s) in the plural optical elements, a combination of plural reflection areas may be selected in plural optical elements.

Figure 7:
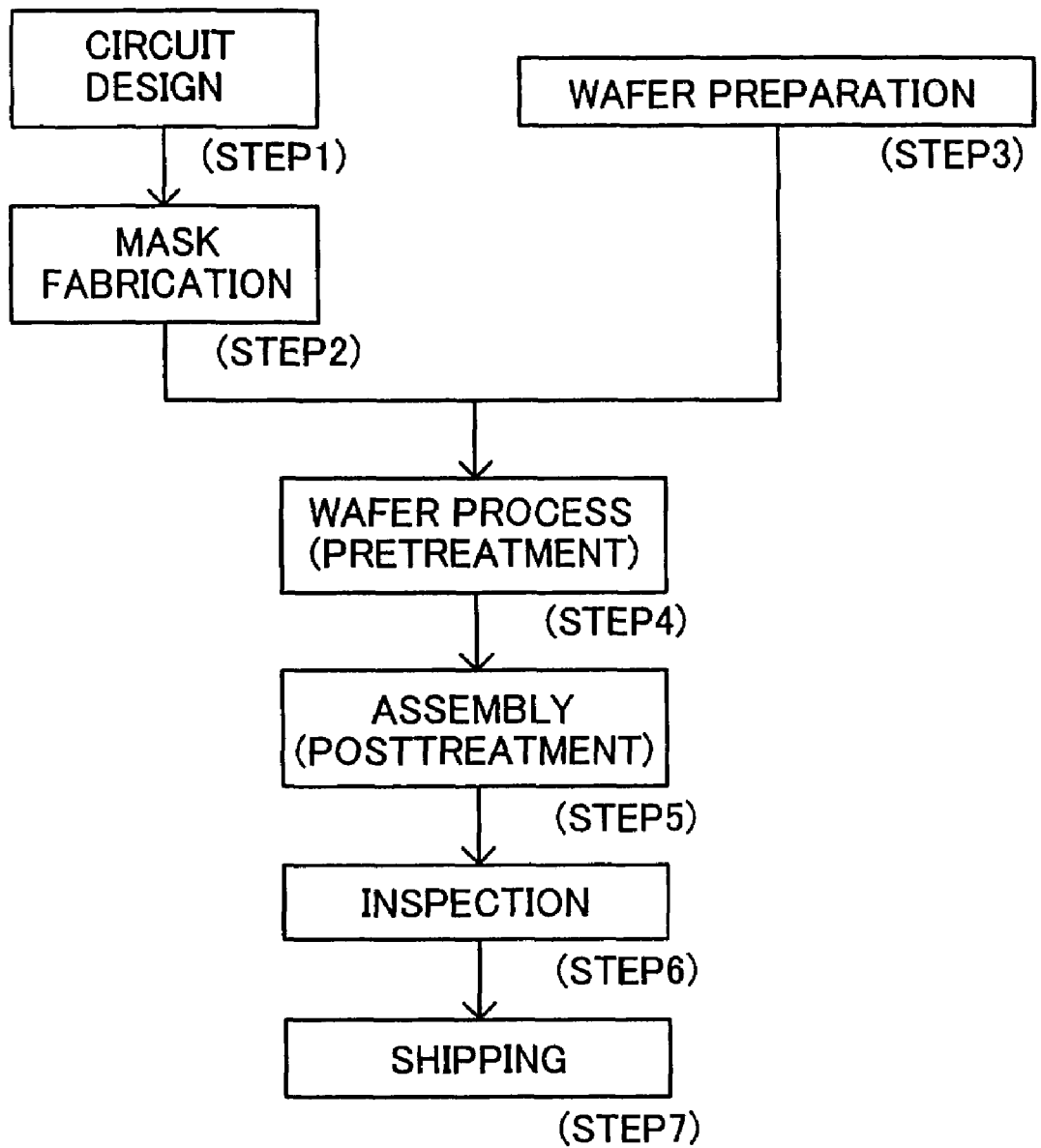
FIG. 7 is a flowchart for explaining a method for fabricating devices (semiconductor chips such as ICs, LSIs, and the like, LCDs, CCDs, etc.).
Figure 8:
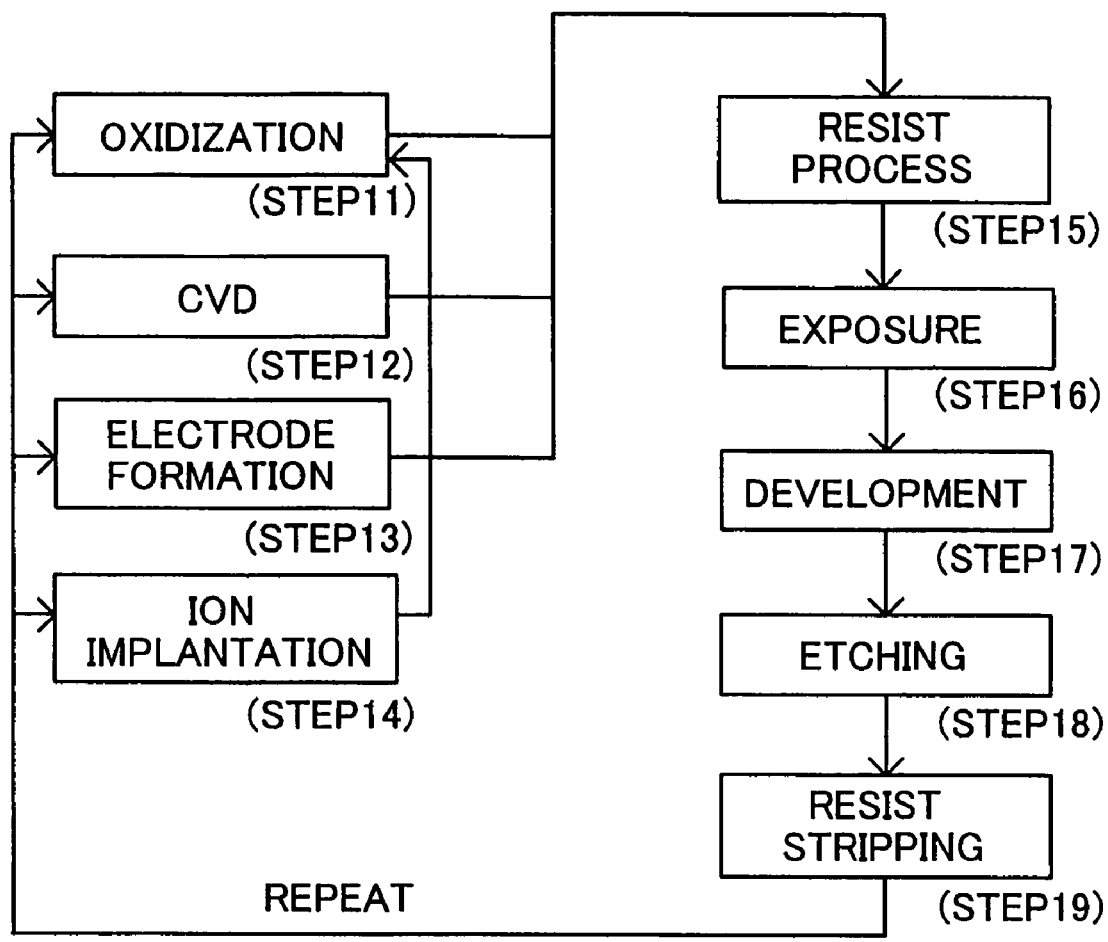
FIG. 8 is a detailed flowchart for Step 4 of wafer process shown in FIG. 7.

Referring to FIGS. 7 and 8, a description will now be given of an embodiment of a device fabricating method using the above exposure apparatus 1. FIG. 7 is a flowchart for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer preparation) manufactures a wafer using materials such as silicon. Step 4 (wafer process), which is referred to as a pretreatment, forms actual circuitry on the wafer through photolithography using the mask and wafer. Step 5 (assembly), which is also referred to as a posttreatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 8 is a detailed flowchart of the wafer process in Step 4 shown in FIG. 7. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus 200 to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and multilayer circuit patterns are formed on the wafer. The device fabrication method of this embodiment may manufacture higher quality devices than the conventional one, by restraining a surface-shape change of the optical element in the projection optical system and correcting a deterioration of the optical performance. Thus, the device fabrication method using the exposure apparatus 1, and the devices as finished goods also constitute one aspect of the present invention.

Further, the present invention is not limited to these preferred embodiments, and various variations and modifications may be made without departing from the scope of the present invention. For example, the number of optical elements in the projection optical system of this embodiment is not limited to six. The present invention is applicable to an exposure that uses a UV light source having a wavelength less than 200 nm other than EUV light, such as ArF excimer laser and $F_2$ laser, and a step-and-repeat exposure apparatus (i.e., stepper).

Thus, the inventive projection optical system, and an exposure apparatus and method may obtain desired resolution, and provide superior exposure performance

What is claimed is:

1. A projection optical system comprising:
   a first mirror that is rotatable around an optical axis of the projection optical system; and
   a second mirror that is not rotatable around the optical axis,
   wherein the first mirror includes a first reflective area and a second reflective area different from the first reflective area,
   wherein the first mirror reflects light in the first reflective area or the second reflective area when rotating around the optical axis,
   wherein the first mirror reflects the light in the first reflective area when a surface shape of the second mirror does not change, and the first mirror reflects the light in the second reflective area when the surface shape of the second mirror changes, and
   wherein a surface shape of the second reflective area of the first mirror is different from that of the first reflective area, and is configured to reduce an aberration that occurs as the surface shape of the second mirror changes.

2. A projection optical system according to claim 1, wherein the aberration includes astigmatism.

3. A projection optical system according to claim 1, wherein the aberration includes at least one of a curvature of field, distortion and coma.

4. An exposure apparatus comprising:
   an illumination optical system configured to illuminate a mask by utilizing light from a light source; and
   a projection optical system according to claim 1 configured to project a pattern of the mask onto a wafer.

5. A device manufacturing method comprising the steps of:
   exposing a wafer by utilizing an exposure apparatus according to claim 4; and
   developing the wafer that has been exposed.

* * * * *